(12) United States Patent
Shimizu et al.

(10) Patent No.: US 9,139,901 B2
(45) Date of Patent: Sep. 22, 2015

(54) PLASMA PROCESSING METHOD

(71) Applicant: TOKYO ELECTRON LIMITED, Tokyo (JP)

(72) Inventors: Akitaka Shimizu, Yamanashi (JP); Tetsuya Ohishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/493,904

(22) Filed: Sep. 23, 2014

(65) Prior Publication Data
US 2015/0083580 A1    Mar. 26, 2015

(30) Foreign Application Priority Data

Sep. 24, 2013  (JP) ................................. 2013-196901

(51) Int. Cl.
C03C 15/00 (2006.01)
C23C 14/34 (2006.01)
H01L 21/3065 (2006.01)

(52) U.S. Cl.
CPC ........ C23C 14/3457 (2013.01); H01L 21/3065 (2013.01); H01L 21/30655 (2013.01)

(58) Field of Classification Search
CPC .............. H01L 21/3065; H01L 21/30655; C23C 14/345; C23C 14/3457
USPC ............ 216/67, 71, 72, 74, 79; 438/714, 719, 438/724
See application file for complete search history.

(56) References Cited

U.S. PATENT DOCUMENTS

| | | | |
|---|---|---|---|
| 2007/0026677 A1* | 2/2007 | Ji et al. .......................... | 438/689 |
| 2010/0203737 A1* | 8/2010 | Morikawa et al. ............ | 438/719 |
| 2011/0045672 A1* | 2/2011 | Srinivasan et al. ............ | 438/696 |
| 2012/0100720 A1* | 4/2012 | Winniczek et al. ........... | 438/695 |
| 2012/0152895 A1* | 6/2012 | Chebi et al. ..................... | 216/37 |
| 2012/0270404 A1* | 10/2012 | Bajaj et al. .................... | 438/700 |
| 2013/0203256 A1* | 8/2013 | Xu et al. ........................ | 438/694 |
| 2013/0328173 A1* | 12/2013 | Fuller et al. ................... | 257/622 |

FOREIGN PATENT DOCUMENTS

| | | |
|---|---|---|
| JP | 60-126835 A | 7/1985 |
| JP | 60-154622 A | 8/1985 |
| JP | 63-13334 A | 1/1988 |
| JP | 2-105413 A | 4/1990 |

* cited by examiner

*Primary Examiner* — Binh X Tran
(74) *Attorney, Agent, or Firm* — Rothwell, Figg, Ernst & Manbeck, P.C.

(57) ABSTRACT

A method includes: etching a target layer of a target object in a processing chamber by generating a plasma of a first gas containing at least one of $SF_6$, $ClF_3$ and $F_2$ supplied into the processing chamber to; and forming a protective film on the target layer by generating a plasma of a second gas containing at least one of hydrocarbon, fluorocarbon, and fluorohydrocarbon supplied into the processing chamber. In the etching, a pressure in the processing chamber is set to a first pressure and a first bias power is applied to a lower electrode. In the forming, the pressure is set to a second pressure lower than the first pressure and a second bias power higher than the first bias power is applied to the lower electrode.

13 Claims, 6 Drawing Sheets

PLASMA PROCESSING METHOD

CROSS-REFERENCE TO RELATED APPLICATION

This application claims priority to Japanese Patent Application No. 2013-196901 filed on Sep. 24, 2013, the entire contents of which are incorporated herein by reference.

FIELD OF THE INVENTION

The present invention relates to a method for processing a target object by using a plasma.

BACKGROUND OF THE INVENTION

In a semiconductor device manufacturing process, a recess such as a hole or a groove is formed in an etching target layer of a target object. Recently, as a size of a semiconductor device is reduced, a shape of a recess formed in the etching target layer is getting miniaturized. Further, an aspect ratio of the shape is getting higher and, thus, a deeper recess is formed in the etching target layer.

Generally, in order to form the recess in the etching target layer, the etching target layer is plasma-etched while using a mask corresponding to the recess to be formed. However, in the case of forming a recess having a large depth by the plasma etching, etching in a horizontal direction is also performed below the mask, which makes it difficult to form a recess having a high aspect ratio. Therefore, there is known a plasma processing method in which a recess having a high aspect ratio is formed by etching an etching target layer in a depth direction while protecting a wall surface of the recess with a protective film by alternately supplying a first gas for etching and a second gas for forming the protective film.

Specifically, Japanese Patent Application Publication No. H2-105413 and Japanese Patent Application Publication No. S63-13334 disclose methods for forming a recess having a high aspect ratio in the target object by repeating a step of etching an etching target layer by using $SF_6$ as the first gas, and a step of forming a protective film by using $CCl_4$ as the second gas. Japanese Patent Application Publication No. S60-126835 discloses a case of using a fluorine-containing gas as the first gas and $NH_3$ gas as the second gas. Japanese Patent Application Publication No. S60-154622 discloses a case of using a fluorine-based gas as the first gas and a gaseous mixture of $SiCl_4$ and $O_2$ as the second gas.

In the methods disclosed in the above-cited references, the protective film is also formed on a bottom surface of the recess formed by the etching. Therefore, in the case of etching the etching target layer after the formation of the protective film, first, the protective film formed on the bottom surface of the recess is removed and, then, the etching target layer is etched in a depth direction. Since the methods disclosed in the above references require the extra step of removing the protective film formed on the bottom surface of the recess, it is difficult to etch the etching target layer in the depth direction at a high etching rate.

SUMMARY OF THE INVENTION

In view of the above, the present invention provides a method for plasma-processing a target object which is capable of forming a shape of a recess having a high aspect ratio at a high etching rate.

In accordance with an aspect of the present invention, there is provided a plasma processing method of processing a target object in a processing chamber by using a plasma generated between an upper electrode and a lower electrode facing the upper electrode. The method includes: an etching step of etching an etching target layer of the target object by supplying a first gas containing at least one of $SF_6$, $ClF_3$ and $F_2$ into the processing chamber and generating a plasma of the first gas while a pressure in the processing chamber is set to a first pressure and a first bias power is applied to the lower electrode; and a first film forming step of forming a protective film on at least a part of the etching target layer by supplying a second gas containing at least one of hydrocarbon, fluorocarbon, and fluorohydrocarbon into the processing chamber and generating a plasma of the second gas while the pressure in the processing chamber is set to a second pressure which is lower than the first pressure and a second bias power which is higher than the first bias power is applied to the lower electrode.

A cycle including the etching step and the first film forming step is repeatedly executed.

In the etching step in the above method, the etching target layer of the target object is etched by the plasma of the first gas. The etching step results in the formation of the recess in the etching target layer, the recess being defined by the sidewall and the bottom surface. Next, in the first film forming step, the plasma of the second gas is generated, and the protective film is formed on a part of the etching target layer. In the first film forming step, the pressure in the processing chamber is set to a relatively low second pressure and a relatively high second bias power is applied to the lower electrode, so that the protective film is formed on the sidewall of the recess and the formation of the protective film on the bottom surface of the recess is suppressed. This is because, in the first film forming step, the pressure in the processing chamber is set to the relatively low second pressure and the relatively high bias power is applied to the lower electrode, so that high-energy ions generated by dissociation of hydrocarbon, fluorocarbon and fluorohydrocarbon contained in the second gas are attracted into the recess and the protective film formed on the bottom surface of the recess is selectively removed by the ion sputtering effect.

Thus, in the etching step to be performed later, the protective film formed on the sidewall prevents contact between active species from the first gas and the etching target layer and the active species actively react with molecules of the etching target layer in the bottom surface of the recess. Therefore, in this method, the etching in the width direction of the etching target layer is suppressed, and the etching in the depth direction of the etching target layer is promoted. Further, in the etching step, the relatively low first bias power is applied to the lower electrode, so that the removal of the protective film formed on the sidewall of the recess by the ions generated by dissociation of $SF_6$, $ClF_3$, and $F_2$ contained in the first gas is suppressed. Accordingly, in accordance with the above method, a shape having a high aspect ratio can be formed at a high etching rate.

In the etching step, $O_2$ gas may be added to the first gas. Since $O_2$ gas is added to the first gas, silicon oxide can be generated on the sidewall of the recess during the etching of the etching target layer. Therefore, a shape having a higher aspect ratio can be formed.

The cycle may further include: a second film forming step of forming a protective film on at least a part of the etching target layer by generating a plasma of the second gas in the processing chamber while the pressure in the processing chamber is set to the first pressure and the first bias power is applied to the lower electrode, which is executed between the etching step and the first film forming step; and a third film forming step of forming a protective film on at least a part of the etching target layer by generating a plasma of the second gas in the processing chamber while the pressure in the processing chamber is set to the first pressure and the second bias power is applied to the lower electrode, which is executed between the second film forming step and the first film forming step.

In the second film forming step of the above method, the pressure in the processing chamber is set to the relatively high first pressure and the relatively low first bias power is applied to the lower electrode. Thus, it is possible to prevent the protective film formed on the sidewall of the recess from being removed by the ions generated from the first gas that has been supplied into the processing chamber in the previous etching step and remained in the processing chamber.

In the third film forming step to be performed later, the pressure in the processing chamber is set to the relatively high first pressure and the relatively high second bias power is applied to the lower electrode. Since the pressure in the processing chamber is set to the relatively high pressure in the third film forming step, the deposition of the protective film on the etching target layer can be promoted. Moreover, in the third film forming step and the first film forming step, the relatively high second bias power is applied, so that the formation of the protective film on the bottom surface of the recess can be suppressed by the ion sputtering effect. Accordingly, in accordance with the method of the present embodiment, it is possible to form the protective film on the sidewall while suppressing the formation of the protective film on the bottom surface of the recess. As a result, a shape having a high aspect ratio can be formed at a high etching rate.

The cycle may further include, before the etching step, a breakthrough step of cleaning the etching target layer by generating a plasma of the first gas in the processing chamber while setting the pressure in the processing chamber to the first pressure and applying the second bias power to the lower electrode.

In the breakthrough step of the above method, the pressure in the processing chamber is set to the relatively high first pressure and the relatively high second bias power is applied to the lower electrode. In the breakthrough step, the ions generated by dissociation of the molecules of the first gas are attracted into the recess by the second bias power, so that the deposits on the bottom surface of the recess can be cleaned. Accordingly, the etching rate in the depth direction of the etching target layer in the etching step to be performed later can be increased.

As the cycle is repeated, the second bias power applied to the lower electrode may be increased in the breakthrough step, the first film forming step and the third film forming step. Further, as the cycle is repeated, a flow rate of the second gas supplied into the processing chamber may be decreased in the first film forming step, the second film forming step, and the third film forming step.

In the case of forming the shape having a high aspect ratio in the etching target layer under constant processing conditions, the recess having a shape that becomes gradually smaller toward the depth direction is formed in the etching target layer. The present inventors have found that this is because, as the aspect ratio is increased, the amount of active species that are supplied to the bottom surface of the recess and contribute to the etching is decreased compared to the amount of active species that are supplied to the bottom surface of the recess and contribute to the formation of the protective film.

In the present embodiment, the flow rate of the second gas supplied into the processing chamber is gradually decreased during the repetition of the sequence in the first film forming step, the second film forming step and the third film forming step, so that the amount of active species that are supplied to the bottom surface of the recess and contribute to the formation of the protective film can be reduced. Therefore, it is possible to prevent the shape of the recess from becoming gradually smaller. In the present embodiment, the bias power applied to the lower electrode is gradually increased in the breakthrough step, the first film forming step and the third film forming step, so that the sputtering effect of the ions generated from the second gas can be increased. This suppresses the formation of the protective film on the bottom surface of the recess. Accordingly, in accordance with the method of the present embodiment, a recess having a high aspect ratio can be formed at a high etching rate.

The second gas may contain at least one of $CH_4$, $CH_3F$, $C_4F_8$, and $C_4F_8$. By using the second gas, it is possible to form the protective film on the sidewall of the recess while suppressing formation of the protective film on the bottom surface of the recess.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
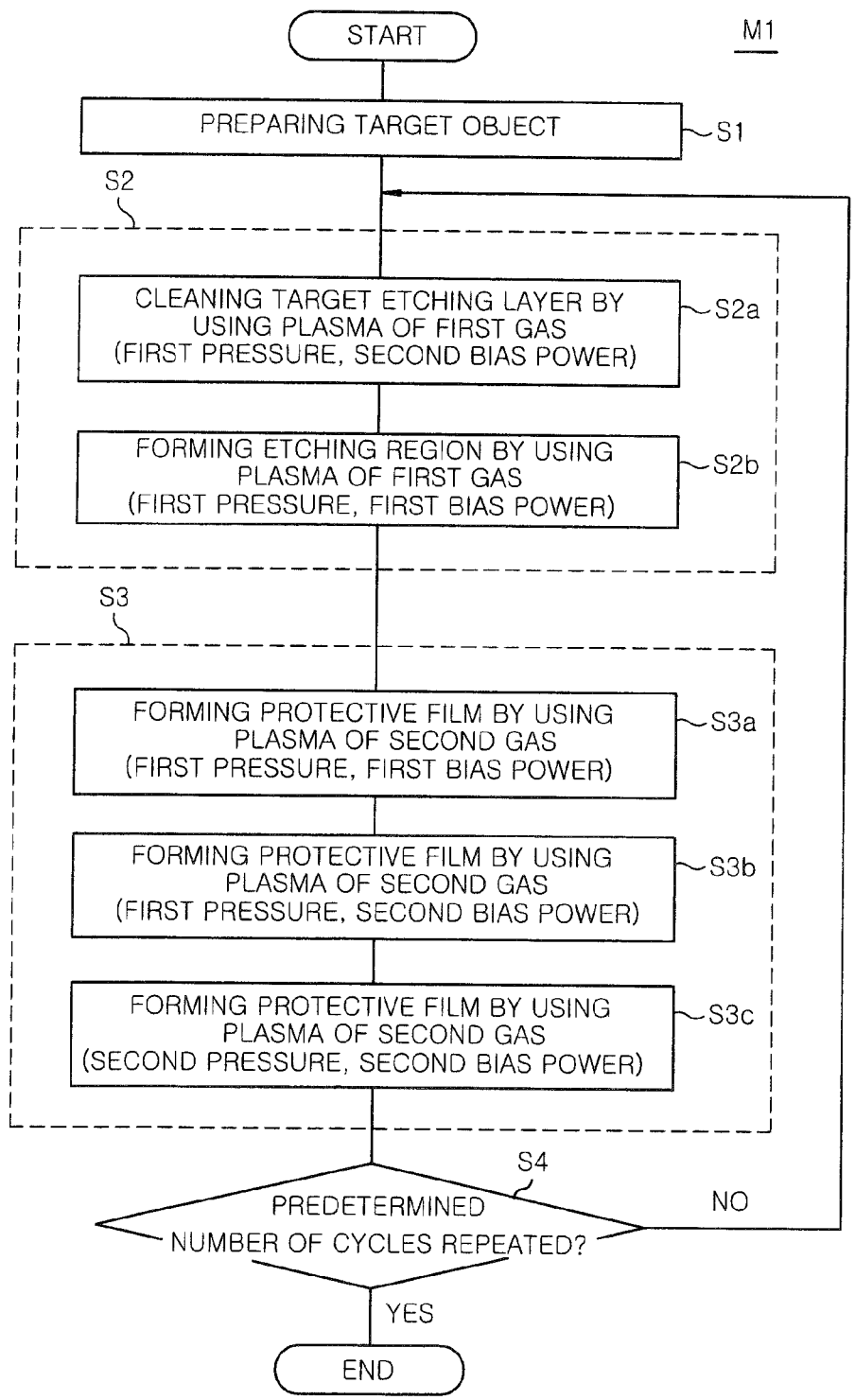
FIG. 1 is a flowchart showing a method for plasma-processing a target object in accordance with an embodiment of the present invention.

Hereinafter, embodiments of the present invention will be described in detail with reference to the accompanying drawings. In the drawings, like reference numerals will be used for like or corresponding parts.

FIG. 1 is a flowchart showing a method for plasma-processing a target object in accordance with an embodiment of the present invention. In a method M1 presented in FIG. 1, a step S2 of etching an etching target layer of the target object by using a plasma of a first gas and a step S3 of forming a protective film on the etching target layer of the target object by using a plasma of a second gas are repeatedly executed.

Figure 2:
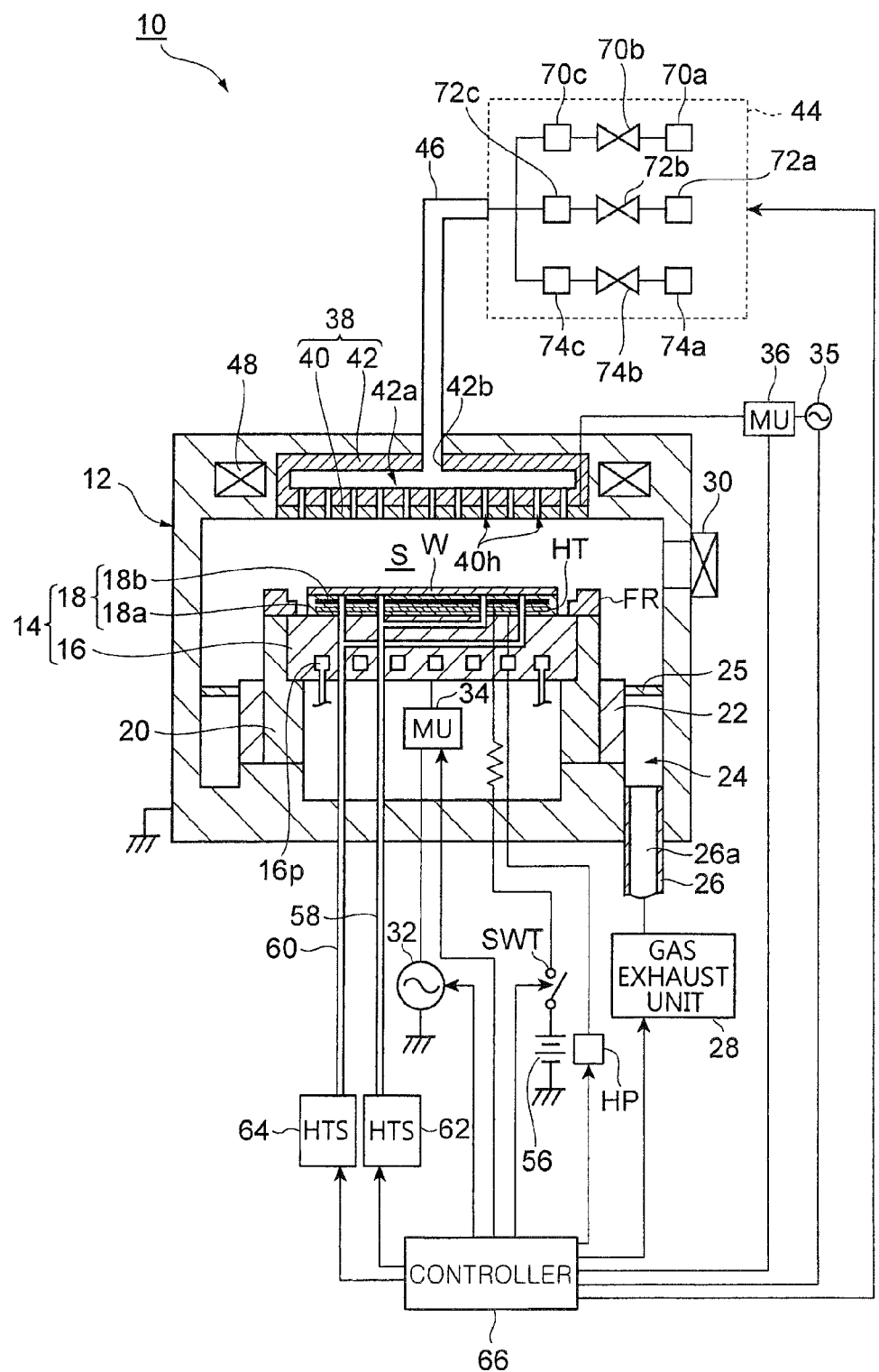
FIG. 2 schematically shows a plasma processing apparatus in accordance with the embodiment of the present invention.

Hereinafter, a plasma processing apparatus used in implementing the method M1 presented in FIG. 1 is described. FIG. 2 is a schematic view showing a cross sectional structure of the plasma processing apparatus 10 in accordance with the embodiment of the present invention.

The plasma processing apparatus 10 includes a processing chamber 12. The processing chamber 12 has a substantially cylindrical shape and has therein a processing space S. A gate valve 30 for opening/closing a loading/unloading port of the target object W is attached to a sidewall of the processing chamber 12. The plasma processing apparatus 10 includes a mounting table 14 provided in the processing chamber 12. The mounting table 14 is disposed below the processing space S. The mounting table 14 has a lower electrode 16 and an electrostatic chuck 18. The lower electrode 16 is formed in a substantially disc shape and has a conductive property. The lower electrode 16 is made of, e.g., aluminum.

A radio frequency (RF) power supply 32 is electrically connected to the lower electrode 16 via a matching unit (MU) 34. The RF power supply 32 applies an RF power for ion attraction, i.e., an RF bias power, having a predetermined high frequency (e.g., 2 MHz to 27 MHz) to the lower electrode 16.

In the present embodiment, a coolant path 16p is formed in the lower electrode 16. The coolant path 16p may be connected to a coolant inlet line and a coolant outlet line. The mounting table 14 is configured such that temperatures of the lower electrode 16 and the electrostatic chuck 18 can be controlled to predetermined levels by circulating a proper coolant, e.g., cooling water or the like, through the coolant path 16p.

In the plasma processing apparatus 10, the electrostatic chuck 18 is provided on a top surface of the lower electrode 16. The electrostatic chuck 18 is a substantially circular plate-shaped member and includes an insulating layer 18a and a power feeding layer 18b. The insulating layer 18a is made of a dielectric material such as ceramic or the like. The power feeding layer 18b is a conductive film embedded in the insulating layer 18a. The power feeding layer 18b is connected to a DC power supply 56 via a switch SWT. When a DC voltage is applied from the DC power supply 56 to the power feeding layer 18b, a Coulomb force is generated and the target object W is attracted and held on the electrostatic chuck 18 by the Coulomb force thus generated.

In the present embodiment, a heater HT as a heating element is buried in the electrostatic chuck 18. The electrostatic chuck 18 is configured to heat the target object W to a predetermined temperature by the heater HT. The heater HT is connected to a heater power supply HP through a wire.

The plasma processing apparatus 10 further includes gas supply lines 58 and 60, and heat transfer gas supply units (HTS) 62 and 64. The heat transfer gas supply unit 62 is connected to the gas supply line 58. The gas supply line 58 extends to the top surface of the electrostatic chuck 18 and then extends annularly at a central portion of the top surface. The heat transfer gas supply unit 62 supplies a heat transfer gas, e.g., He gas, to a gap between the top surface of the electrostatic chuck 18 and the target object W. The heat transfer gas supply unit 64 is connected to the gas supply line 60. The gas supply line 60 extends to the top surface of the electrostatic chuck 18 and then extends annularly in the top surface to surround the gas supply line 58. The heat transfer gas supply unit 64 supplies a heat transfer gas, e.g., He gas, to a gap between the top surface of the electrostatic chuck 18 and the target object W.

The plasma processing apparatus 10 may further include a cylindrical holding portion 20 and a cylindrical supporting portion 22. The cylindrical holding portion 20 holds the lower electrode 16 while contacting with the side surface and the edge portion of the bottom surface of the lower electrode 16. The cylindrical supporting portion 22 vertically extends from the bottom surface of the processing chamber 12 to support the lower electrode 16 via the cylindrical holding portion 20. The plasma processing apparatus 10 may further include a focus ring FR mounted on the top surface of the cylindrical holding portion 20. The focus ring FR may be made of, e.g., quartz.

In the present embodiment, a gas exhaust passage 24 is formed between the sidewall of the processing chamber 12 and the cylindrical supporting portion 22. A baffle plate 25 is provided at an inlet or in the gas exhaust passage 24. Further, a gas exhaust port 26a is provided at a bottom end of the gas exhaust passage 24. The gas exhaust port 26a is defined by a gas exhaust line 26 inserted through the bottom surface of the processing chamber 12. The gas exhaust line 26 is connected to a gas exhaust unit 28. The gas exhaust unit 28 has a vacuum pump, so that the processing space S inside the processing chamber 12 can be depressurized to a predetermined vacuum level.

The plasma processing apparatus 10 further includes a shower head 38 in the processing chamber 12. The shower head 38 is provided above the processing space S. The shower head 38 includes an upper electrode 40 and an electrode holder 42.

The upper electrode 40 is a substantially circular conductive plate. The upper electrode 40 has a plurality of gas ventholes 40h. The upper electrode 40 is detachably held by the electrode holder 42. A buffer space 42a is provided inside the electrode holder 42. The plasma processing apparatus 10 further includes a gas supply unit 44. The gas supply unit 44 is connected to a gas inlet port 42b of the buffer space 42a through a gas supply conduit 46. The gas supply unit 44 can supply a first gas, a second gas, and a third gas into the processing space S.

In the present embodiment, the gas supply unit 44 includes gas sources 70a, 72a and 74a, valves 70b, 72b and 74b and flow rate controllers 70c, 72c and 74c. The gas source 70a is a gas source of the first gas. The first gas is used for etching the etching target layer, i.e., a polycrystalline silicon layer, in the plasma processing apparatus 10. In the present embodiment, the first gas contains at least one of $SF_6$, $ClF_3$ and $F_2$. The gas source 70a is connected to the gas supply conduit 46 via the valve 70b and the flow rate controller 70c such as a mass flow controller.

The gas source 72a is a gas source of a second gas. The second gas is used for generating deposits on the polycrystalline silicon layer that is the etching target layer. The second gas contains at least one of hydrocarbon, fluorocarbon and fluorohydrocarbon. In the present embodiment, the second gas may contain at least one of $CH_4$, $CH_3F$, $C_4F_6$, and $C_4F_8$. The gas source 72a is connected to the gas supply conduit 46 via a valve 72b and a flow rate controller 72c such as a mass flow controller.

The gas source 74a is a gas source of the third gas. The third gas may be added to the first gas. In the present embodiment, the third gas is $O_2$ gas. The gas source 74a is connected to the gas supply conduit 46 via the valve 74b and the flow rate controller 74c such as a mass flow controller.

The electrode holder 42 has a plurality of holes communicating with the gas ventholes 40h and the buffer space 42a. Therefore, the gas is supplied from the gas supply unit 44 into the processing space S via the buffer space 42a and the gas ventholes 40h.

An RF power supply 35 is electrically connected to the upper electrode 40 via a matching unit (MU) 36. In the present embodiment, the RF power supply 35 applies an RF power for plasma generation having a high frequency (e.g., 27 MHz or above) to the upper electrode 40. When the RF power is applied from the RF power supply 35 to the upper electrode 40, a high frequency electric field is generated in a space between the lower electrode 16 and the upper electrode 40 facing each other, i.e., the processing space S, thereby exciting the plasmas of the first and the second gas. Accordingly, in the present embodiment, the lower electrode 16, the upper electrode 40 and the RF power supply 35 constitutes a plasma generation unit.

In the present embodiment, an annularly or concentrically extending magnetic field forming mechanism 48 is provided at a ceiling portion of the processing chamber 12. The magnetic field forming mechanism 48 has a function of facilitating initiation of high frequency discharge (plasma ignition) and stably maintaining the discharge in the processing space S.

In the present embodiment, the plasma processing apparatus 10 further includes a controller 66. The controller 66 is connected to the gas exhaust unit 28, the switch SWT, the RF power supply 32, the matching unit 34, the RF power supply 35, the matching unit 36, the gas supply unit 44, the heat transfer gas supply units 62 and 64, and the heater power supply HP. The controller 66 transmits control signals to the above components. Operations controlled by the control signals from the controller 66 include: a gas exhaust operation of the gas exhaust unit 28, opening/closing of the switch SWT, power supply from the RF power supply 32, impedance adjustment of the matching unit 34, power supply from the RF power supply 35, impedance matching of the matching unit 36, supply of the first gas, the second gas and the additional (third) gas from the gas supply unit 44 and flow rates thereof, supply of the heat transfer gas from the heat transfer gas supply units 62 and 64, and power supply from the heater power supply HP.

In the plasma processing apparatus 10, a gas or gases from at least one of the gas sources 70a, 72a and 74a is or are supplied into the processing chamber 12 to process the target object W. By applying the RF power for plasma generation to the upper electrode 40, a high frequency electric field is generated between the lower electrode 16 and the upper electrode 40. The gas supplied into the processing space S is turned into a plasma by the high frequency electric field. The etching target layer of the target object W is etched by the plasma thus generated. By applying the RF bias power to the lower electrode 16, ions are attracted into the target object W. Accordingly, the etching of the etching target layer of the target object W is promoted.

Figure 3:
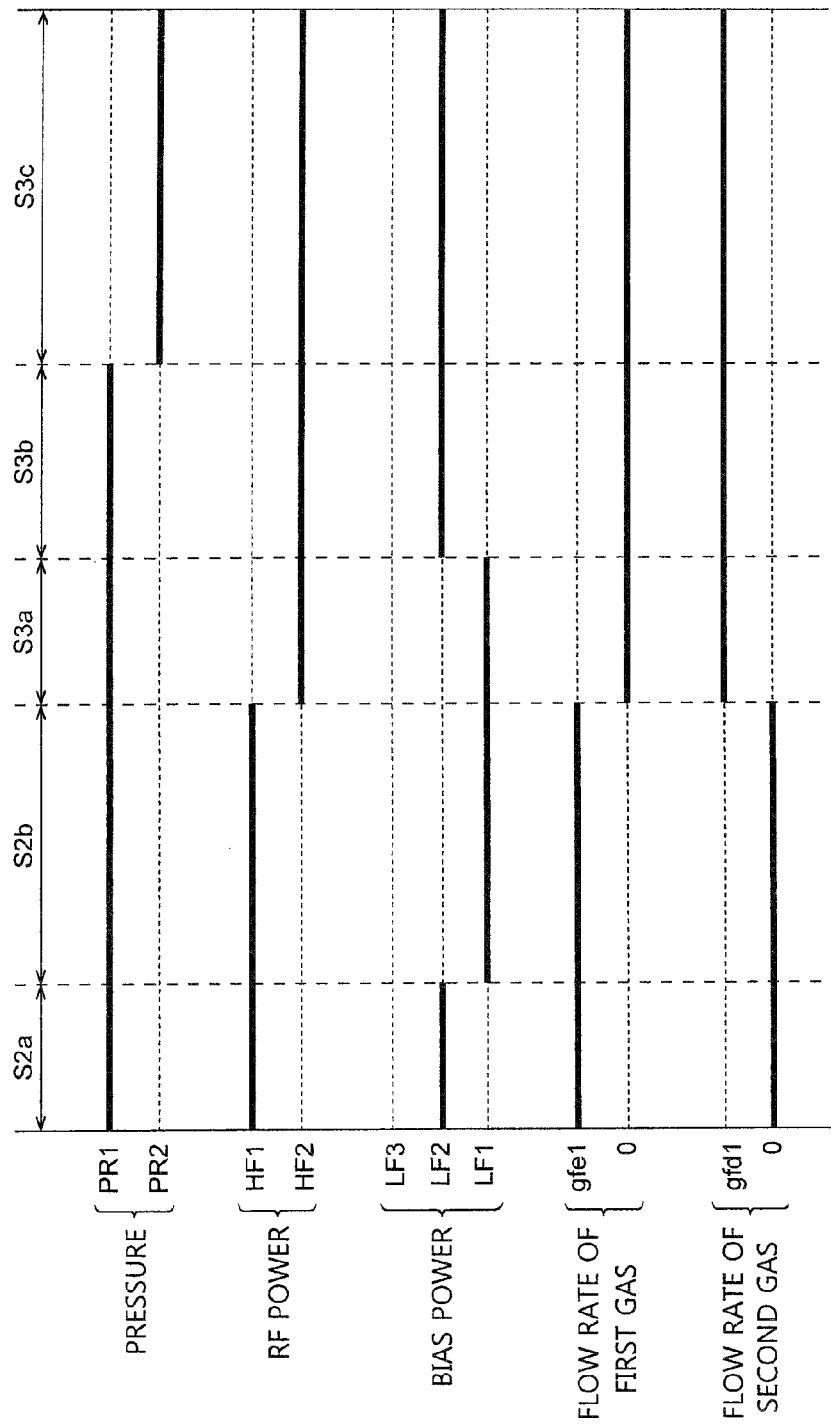
FIG. 3 is a timing chart of the method for plasma-processing a target object in accordance with the embodiment of the present invention.
Figure 4A:
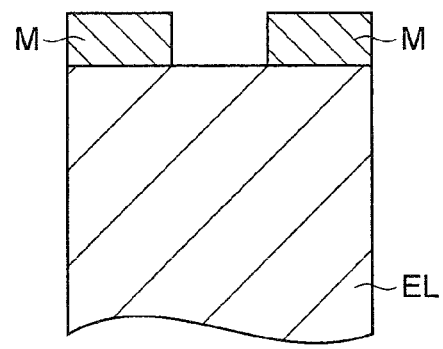
FIGS. 4A to 5C are cross sectional views showing a part of the target object.

Hereinafter, the method M1 that can be implemented by the above plasma processing apparatus 10 will be described in detail with reference to FIGS. 3 to 5 as well as FIG. 1. FIG. 3 is a timing chart for explaining steps of the method M1 in detail. FIGS. 4A to 5C show cross sections of a part of the target object W.

In the method M1 shown in FIG. 1, first, the target object W is prepared in the step S1. As shown in FIG. 4A, the target object W includes an etching target layer EL and a mask M. The etching target layer EL is, e.g., a polycrystalline silicon layer. The mask M is formed on the etching target layer EL and made of, e.g., silicon nitride or silicon oxide.

Next, in the method M1, the step S2 for etching the etching target layer EL of the target object W is executed. The step S2 includes a step S2a (breakthrough step) and a step S2b (etching step). In the step S2a, the target object W is mounted on the electrostatic chuck 18 of the plasma processing apparatus 10 and the etching target layer EL of the target object W is cleaned. The etching target layer EL is cleaned by generating a plasma of the first gas supplied from the gas source 70a in the processing chamber 12 to expose the target object W shown in FIG. 4A to the plasma. The first gas contains at least one of $SF_6$, $ClF_3$, and $F_2$, for example.

Processing conditions in the step S2a will now be described. In the step S2a, the pressure in the processing chamber 12 is set to the first pressure PR1 by exhausting the processing chamber 12 by the gas exhaust unit 28 while supplying the first gas from the gas source 70a at a flow rate gfe1, as shown in FIG. 3. In the case of using $SF_6$ as the first gas, the flow rate gfe1 may be, e.g., about 200 sccm. In the present embodiment, the first pressure PR1 may be, e.g., about 150 mTorr or above. In the step S2a, an RF power HF1 for plasma generation is applied from the RF power supply 35 to the upper electrode 40 and a second bias power LF2 is applied from the RF power supply 32 to the lower electrode 16. The RF power HF1 is, e.g., about 3000 W. The second bias power LF2 may be, e.g., about 100 W or above. In the present embodiment, the second bias power LF2 is about 500 W.

In the step S2b to be executed next, a recess is formed by etching the etching target layer EL of the target object W. In the step S2b, the etching target layer EL is etched by generating a plasma of the first gas supplied from the gas source 70a in the processing chamber 12 and exposing the target object W cleaned in the step S2a to the plasma. In the step S2 of the present embodiment, $O_2$ gas as the third gas may be added to the first gas. By adding $O_2$ gas to the first gas, silicon oxide is generated at the etching target layer EL during the etching of the etching target layer EL and, thus, a recess having a higher aspect ratio can be formed.

The processing conditions in the step S2b will now be described. In the step S2b, the pressure in the processing chamber 12 is set to the first pressure PR1 by exhausting the processing chamber 12 by the gas exhaust unit 28 while supplying the first gas from the gas source 70a at a flow rate gfe1. Further, in the step S2b, the RF power HF1 is applied from the RF power supply 35 to the upper electrode 40 and a first bias power LF1 is applied from the RF power supply 32 to the lower electrode 16. The first bias power LF1 is lower than the second bias power LF2. The first bias power LF1 may be, e.g., about 50 W.

Figure 4B:
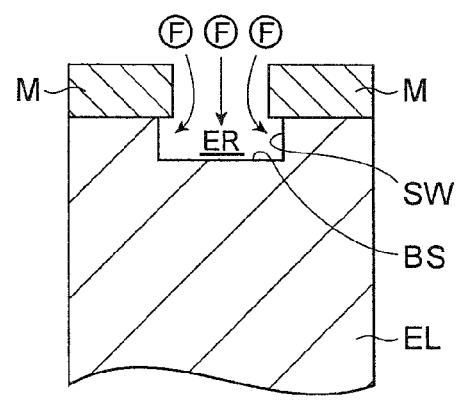

As a result of the step S2b, as shown in FIG. 4B, active species of fluorine (represented by circled "F" in the drawing), such as fluorine ions or fluorine radicals generated by dissociation of the first gas, react with silicon of the etching target layer EL and the etching target layer EL is etched. Hereinafter, a recessed region formed by the step S2b is referred to as an etching region ER. The etching region ER is defined by a sidewall SW and a bottom surface BS.

Next, in the method M1, a step S3 of forming a protective film PF on a part of the surface of the etching target layer EL is executed. The step S3 includes a step S3a (second film forming step: depositing step), a step S3b (third film forming step: depositing step), and a step S3c (first film forming step: forming step). In the steps S3a, S3b and S3c, the protective film PF is formed by generating a plasma of the second gas supplied from the gas source 72a in the processing chamber 12 and exposing the target object W that has been etched in the step S2 to the plasma.

The processing conditions in the step S3a will now be described. In the step S3a, the pressure in the processing chamber 12 is set to the first pressure PR1 by exhausting the processing chamber 12 by the gas exhaust unit 28 while supplying the second gas from the gas source 72a at a flow rate gfd1, as shown in FIG. 3. For example, in the case of using a gas containing $C_4F_8$ gas and $C_4F_6$ gas as the second gas, the flow rate gfd1 may be, e.g., about 330 sccm ($C_4F_8$ gas flow rate: 300 sccm, $C_4F_6$ gas flow rate: 30 sccm). In the step S3a, an RF power HF2 is applied from the RF power supply 35 to the upper electrode 40 and the first bias power LF1 is applied from the RF power supply 32 to the lower electrode 16. The RF power HF2 may be, e.g., about 1500 W.

Next, processing conditions in the step S3b will be described. In the step S3b, the pressure in the processing chamber 12 is set to the first pressure PR1 by exhausting the processing chamber 12 by the gas exhaust unit 28 while supplying the second gas from the gas source 72a at a flow rate gfd1, as shown in FIG. 3. Further, in the step S3b, the RF power HF2 is applied from the RF power supply 35 to the upper electrode 40 and the second bias power LF2 is applied from the RF power supply 32 to the lower electrode 16. In other words, as the step S3a is shifted to the step S3b, the bias power applied to the lower electrode 16 is increased from the first bias power LF1 to the second bias power LF2.

In the steps S3a and S3b, active species of hydrocarbon, fluorocarbon or fluorohydrocarbon which are dissociated from the second gas are deposited on the etching target layer EL. Accordingly, the protective film PF is formed on the sidewall SW and the bottom surface BS. Further, in the steps S3a and S3b, the pressure in the processing chamber 12 is set to the relatively high first pressure PR1, so that the formation of the protective film PF is promoted. In the step S3a, the relatively low first bias power LF1 is applied, so that the protective film PF is prevented from being removed by the active species of fluorine remaining in the processing chamber 12.

Next, processing conditions in the step S3c will be described. In the step S3c, the pressure in the processing chamber 12 is set to the second pressure PR2 by exhausting the processing chamber 12 by the gas exhaust unit 28 while supplying the second gas from the gas source 72a at a flow rate gfd1, as shown in FIG. 3. The second pressure PR2 is lower than the first pressure PR1. In the present embodiment, the second pressure PR2 may be lower than or equal to about 75 mTorr. Further, in the step S3c, the second RF power HF2 is applied from the RF power supply 35 to the upper electrode 40 and the second bias power LF2 is applied from the RF power supply 32 to the lower electrode 16. In other words, as the step S3b is shifted to the step S3c, the pressure in the processing chamber 12 is decreased from the first pressure PR1 to the second pressure PR2.

Figure 4C:
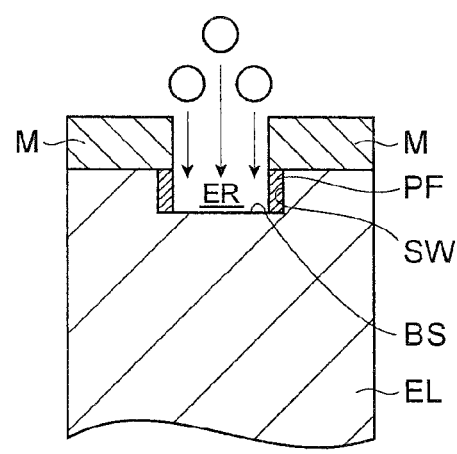

In the step S3c, the pressure in the processing chamber 12 is set to the relatively low second pressure PR2 and the relatively high bias power LF2 is applied to the lower electrode 16. In the step S3c, active species of hydrocarbon, fluorocarbon or fluorohydrocarbon contained in the second gas are deposited, thereby forming the protective film PF on the sidewall SW and the bottom surface BS. In the step S3c, high-energy ions (represented by circles in the drawing) generated by dissociation of hydrocarbon, fluorocarbon or fluorohydrocarbon in the second gas are vertically attracted into the etching region ER, as shown in FIG. 4C. Accordingly, the high-energy ions collide with the bottom surface BS, and the protective film formed on the bottom surface BS is removed by the ion sputtering effect. Therefore, in the step S3c, the formation of the protective film PF on the bottom surface BS is suppressed. In the step S3c of the above processing conditions, the removal of the protective film PF by the ion sputtering is more dominant on the bottom surface BS than the deposition rate of the protective film PF. As a result, the protective film PF is not formed on the bottom surface BS and the polycrystalline silicon layer is exposed.

Meanwhile, on the sidewall SW, the amount of ions colliding with the protective film PF is smaller than the amount of ions colliding with the protective film PF formed on the bottom surface BS, so that the deposition rate of the protective film PF is more dominant than the removal of the protective film by the ion sputtering, which results in the formation of the protective film PF on the sidewall SW. Hence, as shown in FIG. 4C, the protective film PF is formed on the sidewall, not on the bottom surface BS, by the step S3c.

Figure 5A:
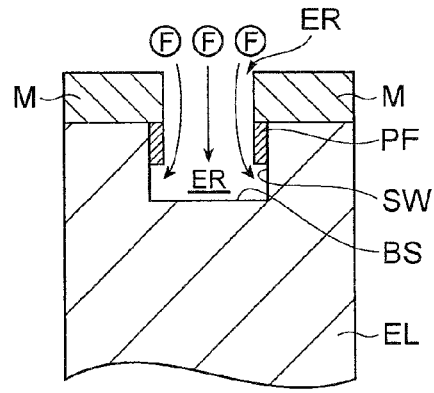
Figure 5B:
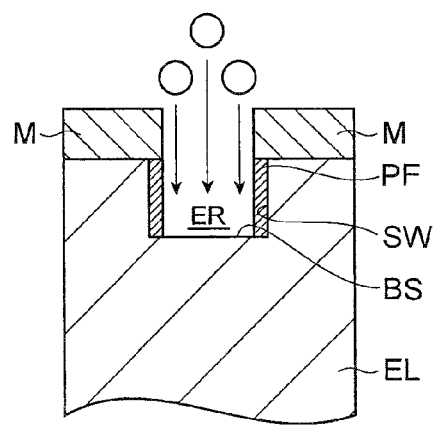
Figure 5C:
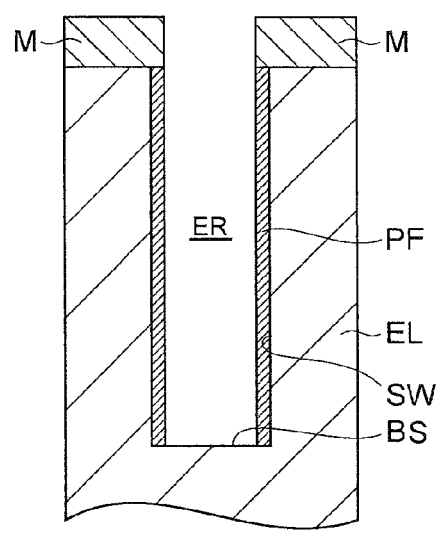

In the method M1, the etching target layer EL is etched by further executing the step S2. In other words, the bottom surface BS is cleaned by executing the step S2a. Further, as shown in FIG. 5A, the bottom surface BS where the polycrystalline silicon layer is exposed is etched in a depth direction by executing the step S2b. At this time, a portion of the sidewall SW where the protective film PF is formed is not etched. Next, as shown in FIG. 5B, the protective film PF is formed on the sidewall SW by further executing the step S3. Thereafter, in step S4 shown in FIG. 1, it is determined whether or not the steps S2 and S3 have been repeated a predetermined number of cycles. When the repetition number of the steps S2 and S3 does not reach the predetermined number of cycles, the steps S2 and S3 are further executed. On the other hand, when the repetition number of the steps S2 and S3 reaches the predetermined number of cycles, the method M1 is completed. By repeating the steps S2 and S3 the predetermined number of cycles, the etching region ER having a high aspect ratio is formed, as shown in FIG. 5C.

As described above, in the step S3c of the method M1, the pressure in the processing chamber 12 is set to the relatively low second pressure PR2 and the relatively high second bias power LF2 is applied to the lower electrode 16. Accordingly, high-energy ions generated by dissociation of hydrocarbon, fluorocarbon or fluorohydrocarbon contained in the second gas are attracted into the etching region ER. Accordingly, the protective film formed on the bottom surface BS is selectively removed by the ion sputtering effect. Hence, in the step S3c, the formation of the protective film PF on the bottom surface BS is suppressed and the protective film PF is formed on the sidewall SW.

Thereafter, during the step S2b, the active species of fluorine which contribute to the etching are prevented from contacting the sidewall SW of the etching target layer EL by the protective film PF and the active species of fluorine actively react on the bottom surface BS with the silicon of the etching target layer EL. Therefore, in the method M1, the etching in the width direction of the etching target layer EL is suppressed and the etching in the depth direction of the etching target layer EL is promoted. In the step S2b, the etching is performed by applying the relatively low first bias power LF1 to the lower electrode 16, so that the removal of the protective film PF formed on the sidewall by the fluorine ions is suppressed. Hence, in accordance with the method M1, a recess having a high aspect ratio can be formed at a high etching rate.

In the present embodiment, the second bias power applied to the lower electrode 16 may be gradually increased in the steps S2a, S3b and S3c during the repetition of the cycle including the steps S2 and S3. Further, in the present embodiment, the flow rate of the second gas supplied into the processing chamber may be gradually decreased in the steps S3a, S3b and S3c. For example, after the aspect ratio of the etching region ER exceeds a predetermined value, the bias power applied to the lower electrode 16 may be gradually increased in the steps S2a, S3b, and S3c so that the second bias power applied to the lower electrode 16 becomes finally 1000 W. Also, the flow rate of the second gas supplied into the processing chamber 12 may be gradually decreased from 330 sccm to 305 sccm ($C_4F_8$ gas flow rate: 300 sccm, $C_4F_6$ gas flow rate: 5 sccm) in the steps S3a, S3b, and S3c.

When the recess having a high aspect ratio is formed in the etching target layer EL under the constant processing conditions, the etching region ER having a shape that becomes gradually narrower toward the depth direction tends to be formed in the etching target layer EL. This is because, as the aspect ratio is increased, the amount of active species that are supplied to the bottom surface BS for etching becomes smaller than the amount of active species that are supplied to the bottom surface BS for forming the protective film PF.

As the cycle is repeated, the amount of active species that are supplied to the bottom surface BS to form the protective film PF can be decreased by decreasing the flow rate of the second gas supplied into the processing chamber 12 in the steps S3a, S3b, and S3c. Therefore, it is possible to prevent the shape of the etching region ER from becoming gradually narrower. Further, the sputtering effect of the ions generated from the second gas can be enhanced by increasing the bias power applied to the lower electrode 16 in the steps S2a, S3b, and S3c. Hence, the formation of the protective film PF on the bottom surface BS is further suppressed. Accordingly, in accordance with the present embodiment, a recess having a high aspect ratio can be formed at a high etching rate.

Hereinafter, a test example using the method of the above-described embodiments is described.

Figure 6:
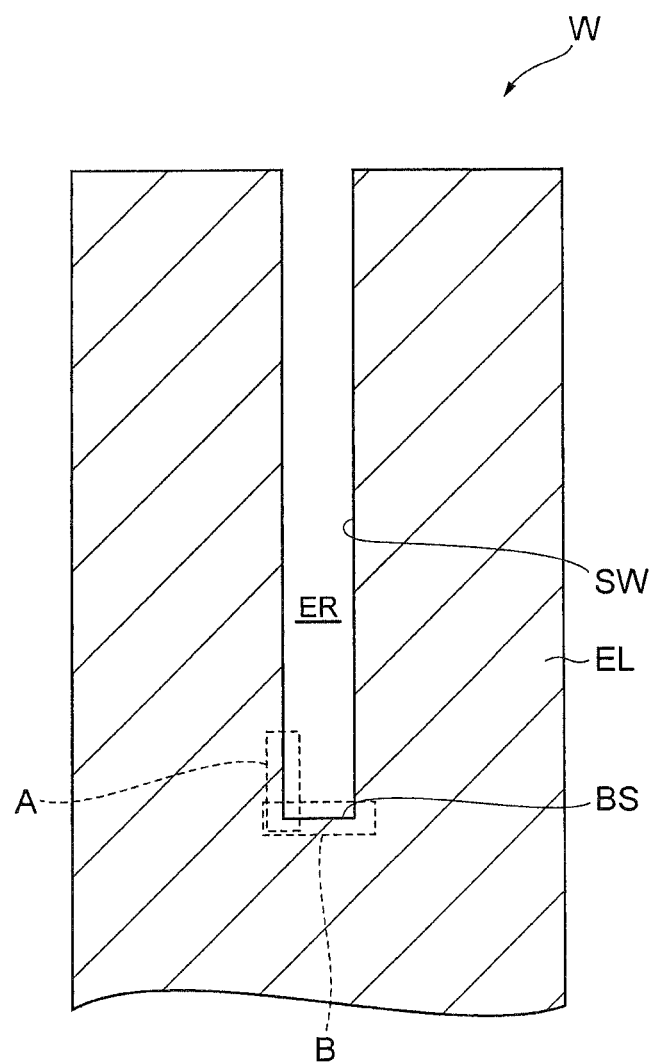
FIG. 6 illustrates a sample used in a test example.

In the test example, a film thickness of a protective film PF formed on a wall surface of a recess was evaluated while varying a bias power applied to the lower electrode 16 and a pressure in the processing chamber 12. In the test example, the protective film PF was formed on a sample shown in FIG. 6 which has a hole with a depth of 100 μm. Then, an SEM (Scanning Electron Microscopy) image of a cross section of an etching target layer EL that has been subjected to the processing of the test example was obtained to monitor the film thickness of the protective film PF formed at a lower most region A of a sidewall SW of the hole and a region B of a bottom surface BS of the hole. In the test example, the protective film was formed on the surface of the etching target layer EL under the following conditions. In the test example, $C_4F_8$ gas was used as the second gas supplied into the processing chamber 12.

(Processing Conditions for the Test Example)
RF power applied to the upper electrode 40: 2000 W
$C_4F_8$ gas flow rate: 200 sccm
Processing time: 360 sec The test example was executed by varying the pressure in the processing chamber 12 to 50 mTorr and 100 mTorr and varying the bias power applied to the lower electrode 16 to 0 W, 100 W and 200 W with respect to each of the pressures. As a result, it was found that the protective film PF was not formed in the region B in the case where the pressure in the processing chamber 12 was set to 50 mTorr and the bias power applied to the lower electrode 16 was set to 100 W and in the case where the pressure in the processing chamber 12 was set to 50 mTorr and the bias power applied to the lower electrode 16 was set to 200 W. Further, it was found that, in such cases, the protective film PF having a sufficient thickness was formed at the region A on the sidewall SW.

Meanwhile, it was found that the thickness of the protective film PF was greater at the region B than at the region A in the case where the pressure in the processing chamber 12 was set to 50 mTorr and the bias power applied to the lower electrode 16 was set to 0 W and in the case where the pressure in the processing chamber 12 was set to 100 mTorr and the bias power applied to the lower electrode 16 was set to 0 W, 100 W, or 200 W. The result of the test example shows that it is possible to form the protective film PF on the sidewall SW while suppressing the formation of the protective film PF on the bottom surface BS of the etching target layer EL by setting the pressure in the processing chamber 12 to a relatively low level and applying a relatively high bias power to the lower electrode 16.

While the embodiments of the present invention have been described, the present invention may be variously modified without being limited to the above embodiments. For example, the plasma processing apparatus used for implementing the method M1 is not limited to the above-described plasma processing apparatus 10. The method M1 can be implemented by a plasma processing apparatus in which an RF power for plasma generation is supplied to the lower electrode. The method M1 can also be implemented by a plasma processing apparatus using a microwave as a plasma source or an inductively coupled plasma processing apparatus, other than a parallel plate type plasma processing apparatus.

Further, in the method M1, the steps S2a, S3a, and S3b are additional steps which are not necessarily required. If at least the steps S2b and S3c are executed, it is possible to form the protective film PF on the sidewall SW while suppressing the formation of the protective film PF on the bottom surface BS of the etching target layer EL.

While the invention has been shown and described with respect to the embodiments, it will be understood by those skilled in the art that various changes and modifications may be made without departing from the scope of the invention as defined in the following claims.

What is claimed is:

1. A plasma processing method of processing a target object in a processing chamber by using a plasma generated between an upper electrode and a lower electrode facing the upper electrode, the method comprising:

etching an etching target layer of the target object by supplying a first gas containing at least one of $SF_6$, $ClF_3$ and $F_2$ into the processing chamber and generating a plasma of the first gas while a pressure in the processing chamber is set to a first pressure and a first bias power is applied to the lower electrode; and forming a protective film on at least a part of the etching target layer by supplying a second gas containing at least one of hydrocarbon, fluorocarbon, and fluorohydrocarbon into the processing chamber and generating a plasma of the second gas while the pressure in the processing chamber is set to a second pressure which is lower than the first pressure and a second bias power which is higher than the first bias power is applied to the lower electrode, wherein a cycle including the etching and the forming is repeatedly executed.

2. The plasma processing method of claim 1, wherein the second gas contains at least one of $CH_4$, $CH_3F$, $C_4F_6$, and $C_4F_8$.

3. The plasma processing method of claim 1, wherein the cycle further includes:

depositing a protective film on at least a part of the etching target layer by generating a plasma of the second gas in the processing chamber while the pressure in the processing chamber is set to the first pressure and the first bias power is applied to the lower electrode, which is executed between the etching and the forming; and depositing a protective film on at least a part of the etching target layer by generating a plasma of the second gas in the processing chamber while the pressure in the processing chamber is set to the first pressure and the second bias power is applied to the lower electrode, which is executed between the depositing and the forming.

4. The plasma processing method of claim 3, wherein the cycle further includes, before the etching, cleaning the etching target layer by generating a plasma of the first gas in the processing chamber while setting the pressure in the processing chamber to the first pressure and applying the second bias power to the lower electrode.

5. The plasma processing method of claim 4, wherein as the cycle is repeated, a flow rate of the second gas supplied into the processing chamber is decreased.

6. The plasma processing method of claim 4, wherein as the cycle is repeated, the second bias power applied to the lower electrode is increased.

7. The plasma processing method of claim 6, wherein as the cycle is repeated, a flow rate of the second gas supplied into the processing chamber is decreased.

8. The plasma processing method of claim 1, wherein in the etching, $O_2$ gas is added to the first gas.

9. The plasma processing method of claim 8, wherein the cycle further includes:
- depositing a protective film on at least a part of the etching target layer by generating a plasma of the second gas in the processing chamber while the pressure in the processing chamber is set to the first pressure and the first bias power is applied to the lower electrode, which is executed between the etching and the forming; and
- depositing a protective film on at least a part of the etching target layer by generating a plasma of the second gas in the processing chamber while the pressure in the processing chamber is set to the first pressure and the second bias power is applied to the lower electrode, which is executed between the depositing and the forming.

10. The plasma processing method of claim 9, wherein the cycle further includes, before the etching, cleaning the etching target layer by generating a plasma of the first gas in the processing chamber while setting the pressure in the processing chamber to the first pressure and applying the second bias power to the lower electrode.

11. The plasma processing method of claim 10, wherein as the cycle is repeated, a flow rate of the second gas supplied into the processing chamber is decreased.

12. The plasma processing method of claim 10, wherein as the cycle is repeated, the second bias power applied to the lower electrode is increased.

13. The plasma processing method of claim 12, wherein as the cycle is repeated, a flow rate of the second gas supplied into the processing chamber is decreased.

* * * * *